(12) United States Patent
Poon et al.

(10) Patent No.: US 6,989,887 B2
(45) Date of Patent: Jan. 24, 2006

(54) DUAL FORCE MODE FINE STAGE APPARATUS

(75) Inventors: Alex Ka Tim Poon, San Ramon, CA (US); Royal W. Cherry, III, San Jose, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/876,431

(22) Filed: Jun. 6, 2001

(65) Prior Publication Data

US 2002/0185983 A1 Dec. 12, 2002

(51) Int. Cl.
*G03B 27/42* (2006.01)
*G03B 27/58* (2006.01)
*G03B 27/62* (2006.01)

(52) U.S. Cl. .............................. 355/72; 355/53; 355/75
(58) Field of Classification Search .................. 355/53, 355/72, 75, 77; 250/492, 492.22, 492.2; 318/611, 318/649; 248/638; 310/10, 12
See application file for complete search history.

(56) References Cited

U.S. PATENT DOCUMENTS

| | | | |
|---|---|---|---|
| 5,585,629 A | * 12/1996 | Doran et al. | |
| 5,841,250 A | 11/1998 | Korenage et al. | ............ 318/135 |
| 6,008,610 A | * 12/1999 | Yuan et al. | |
| 6,177,978 B1 | 1/2001 | Korenaga | ..................... 355/53 |
| 6,260,282 B1 | * 7/2001 | Yuan et al. | |
| 6,570,645 B2 | 5/2003 | Korenaga et al. | ............. 355/75 |
| 2003/0007140 A1 | 1/2003 | Korenaga | ..................... 355/72 |

FOREIGN PATENT DOCUMENTS

| | | | |
|---|---|---|---|
| JP | 2000-223410 | | 8/2000 |
| JP | 2002-223410 | * | 8/2000 |

\* cited by examiner

*Primary Examiner*—Alan Mathews
(74) *Attorney, Agent, or Firm*—Aka Chan LLP

(57) ABSTRACT

Methods and apparatus for both coarsely and accurately controlling a scanning stage are disclosed. According to one aspect of the present invention, an apparatus for scanning an object includes a first stage that is coupled to a first actuator which moves the first stage along an axis, as well as a second stage that is arranged to accommodate the object. A first coupler which has first and second ends is aligned along the axis such that the first and second ends of the first coupler contact the first and second stages, respectively. A second coupler which also has first and second ends is aligned along the axis such that the first and second ends of the second coupler contact the first and second stages, respectively. When the first stage scans in a first direction, the first coupler causes the second stage to scan along the axis through the first coupler.

25 Claims, 10 Drawing Sheets

DUAL FORCE MODE FINE STAGE APPARATUS

BACKGROUND OF THE INVENTION

1. Field of Invention

The present invention relates generally to semiconductor processing equipment. More particularly, the present invention relates to a scanning stage apparatus which provides for high acceleration when accuracy requirements are relatively low, and high accuracy when acceleration requirements are relatively low.

2. Description of the Related Art

Scanning stages such as reticle scanning stages are often used in semiconductor fabrication processes. Reticle scanning stages are generally used to accurately position a reticle or reticle for exposure over a semiconductor wafer. Patterns are generally resident on a reticle, which effectively serves as a mask or a negative for a wafer. In general, a reticle may be formed from a silicon nitride film on which a thin metal pattern is placed. When a reticle is positioned over a wafer as desired, a beam of light or a relatively broad beam of electrons may be collimated through a reduction lens, and provided to the reticle, which may be formed from silicon nitride film on which a thin metal pattern is placed. Portions of a light beam, for example, may be absorbed by the reticle while other portions pass through the reticle and are focused onto a wafer.

A reticle positioning stage which positions a reticle for exposure over a wafer is generally a high accuracy stage, since the positioning of the reticle is critical in ensuring that beams may be properly focused onto the wafer. FIG. 1 is a diagrammatic block diagram representation of a conventional reticle positioning stage. A reticle positioning stage 104 includes a coarse stage 108 and a fine stage 112. Coarse stage 108 is arranged to coarsely position a reticle 116, i.e., position reticle 116 near a desired position. Fine stage 112, on the other hand, is arranged to finely tune the position of reticle 116 once reticle 116 is positioned near its desired position by coarse stage 108.

Fine stage 112 is coupled to coarse stage 108, typically through actuators (not shown), such that accelerating coarse stage 108 effectively accelerates fine stage 112, while fine stage 112 may accelerate without causing coarse stage 108 to accelerate significantly. That is, when coarse stage 108 accelerates, fine stage 112 accelerates along with coarse stage 108. However, when fine stage 112 accelerates, coarse stage 108 does not accelerate as a result of acceleration of fine stage 112.

Actuators are typically positioned such that fine stage 112 may accelerate, or otherwise move, in an x-direction 120 and a y-direction 124. Coarse stage 108 is generally coupled to, or is part of, an actuator that enables coarse stage 108 to accelerate in y-direction 124. The actuators used to enable coarse stage 108 to accelerate are generally relatively high efficiency actuators that generate a relatively large amount of force, and are capable of high acceleration. Such actuators are generally relatively large, e.g., heavy, as the actuators are rated for efficiency and power.

Motion of coarse stage 108 in y-direction 124 is typically "long," or has a relatively large amount of travel, as motion in y-direction 124 is used to scan a reticle. Motion of fine stage 112 in y-direction 124, which is independent of the motion of coarse stage 108 in y-direction 124 may have a stroke that varies in size from the stroke associated with motion of fine stage 112 in x-direction 120. In general, motion of fine stage 112 in x-direction 120 may require a substantially larger stroke size than motion of fine stage 112 in y-direction, as motion in y-direction may be complemented or augmented with motion of coarse stage 108 in y-direction 124.

As the need for semiconductors grows, the throughput requirements associated with semiconductor fabrication equipment also increases. Specifically, the throughput requirements associated with reticle scanning stages are increasing. Higher throughput requirements typically require higher acceleration in a reticle scanning stage. Increasing the acceleration capabilities of a reticle scanning stage generally results in an increase in the size of actuators used in the reticle scanning stage, as the increasing the efficiency and the power of an actuator often increases the size of the actuator. Specifically, the size of the actuator which accelerates a coarse stage, e.g., coarse stage 108 of FIG. 1, may increase, as will the size of the actuator which accelerates a fine stage, e.g., fine stage 112 of FIG. 1.

While increasing the size of an actuator used to accelerate a coarse stage may be acceptable, increasing the size of an actuator that acts between the coarse stage and a fine stage often is not acceptable. The mass associated with more efficient, more powerful actuators may adversely affect the performance of a fine stage, as the additional space needed by the more powerful actuators may not be readily available. Further, actuators which have a relatively high efficiency rating and a relatively high power rating generally have lower positioning accuracy capabilities than actuators which have a lower efficiency rating and a lower power rating.

Conventionally, increasing the throughout requirements of a reticle scanning stage may cause the accuracy associated with the reticle scanning stage to be compromised, as actuators which are capable of higher accelerations are generally more difficult to control and, hence, less accurate. In addition to being less accurate, it is also difficult to position large actuators such that a line of force associated with the actuators may cross through the center of gravity. When the line of force is not through the center of gravity of the fine stage, then a substantial "balancing mass" is required to balance the overall stage. The use of such a balancing mass may further increase the size of the overall stage. To increase the accuracy associated with a reticle scanning stage and to substantially minimize the size of the reticle scanning stage, smaller, more controllable actuators may be used with the reticle scanning stage, at the expense of acceleration capabilities.

Therefore, what is desired is reticle scanning stage which is both accurate and capable of high accelerations. That is, what is needed is a reticle scanning stage which is has a high level of accuracy and a high range of accelerations, and effectively does not require that high force, high mass actuators be used to couple a fine stage portion of the reticle scanning stage to a coarse stage portion of the reticle scanning stage.

SUMMARY OF THE INVENTION

The present invention relates to a scanning stage that may be both coarsely controlled and accurately controlled. According to one aspect of the present invention, a scanning apparatus that is suitable for scanning an object along a first axis includes a first actuator, first and second stages, and first and second couplers. The first stage is coupled to the first actuator which moves the first stage along the first axis, while the second stage is arranged to accommodate the object. The first coupler has a first end and a second end, and is aligned along the first axis such that the first end of the first coupler contacts the first stage and the second end of the first coupler contacts the second stage. The second coupler also has a first end and a second end, and is aligned along the first axis such that the first end of the second coupler contacts the first stage and the second end of the second coupler contacts the second stage. When the first actuator causes the first stage to scan along the first axis in a first direction, the first coupler causes the second stage to scan along the first axis through the first coupler. In one embodiment, when the first actuator causes the first stage to scan along the first axis in a first direction, the first coupler is in a first state and the second coupler is in a second state.

A reticle scanning stage which has dual force modes, i.e., which is suitable for coarse control as well as fine control, enables the size and the mass of the overall stage to be substantially minimized without sacrificing accuracy while allowing throughput requirements to be met. The use of cords, for example, to enable a fine stage to accelerate with a coarse stage when accuracy requirements are relatively low allows the use of some high force actuators in the overall stage to be reduced. When a cord is pulled into tension, the cord effectively functions as a stiff connection between the coarse stage and the fine stage such that the fine stage is accelerated along with the coarse stage. When accuracy requirements are relatively high, e.g., when the fine stage is essentially positioned in its desired vicinity, the fine stage may be controlled by low force actuators. Hence, the size of the overall stage may be substantially reduced, thereby reducing power consumption by the overall stage, while still enabling high accuracy requirements and throughput requirements to be met.

According to another aspect of the present invention, a scanning apparatus that is suitable for scanning a reticle along a first axis includes a first actuator and a coarse stage that is coupled to the first actuator. The first actuator is arranged to accelerate the coarse stage along the first axis. The apparatus also includes a fine stage on which the reticle may be positioned, as well as a first coupler. The first coupler has a first end, a second end, and a central axis. The central axis of the first coupler is aligned along the first axis, and the first end of the first coupler is carried by the coarse stage, while the second end of the first coupler is carried by the fine stage. When the first actuator causes the coarse stage to scan along the first axis in a first direction, the first coupler enables a relatively high transmissibility between the coarse stage and the fine stage through the first coupler such that the fine stage scans along the first axis with the coarse stage. Alternatively, when the first actuator causes the coarse stage to scan along the first axis in a second direction, the first coupler enables a relatively low transmissibility between the coarse stage and the fine stage through the first coupler.

In one embodiment, the apparatus also includes a second coupler which has a first end, a second end, and a central axis that is aligned along the first axis. The first end of the second coupler is carried by the coarse stage and the second end of the second coupler is carried by the fine stage such that when the first actuator causes the coarse stage to scan in the first direction, the second coupler enables a relatively low transmissibility between the coarse stage and the fine stage through the second coupler. In such an embodiment, when the first actuator causes the coarse stage to scan in the second direction, the second coupler enables a relatively high transmissibility between the coarse stage and the fine stage through the second coupler.

According to still another aspect of the present invention, a scanning apparatus that is suitable for scanning a reticle along a first axis includes a first actuator, a coarse stage that is coupled to the first actuator, a fine stage, and a first cord. The first actuator accelerates the coarse stage along the first axis, and the fine stage carries the reticle thereon. The first cord has first and second ends, as well as a central axis that is substantially aligned along the first axis. The first end of the first cord is coupled to the coarse stage, and the second end of the first cord is coupled to the fine stage. When the first actuator causes the coarse stage to accelerate along the first axis in a first direction, the first cord is substantially stiff between the coarse stage and the fine stage such that the first cord enables a relatively high transmissibility between the coarse stage and the fine stage through the first cord. Alternatively, when the first actuator causes the coarse stage to accelerate along the first axis in a second direction, the first cord is substantially slack between the coarse stage and the fine stage such that the first cord enables a relatively low transmissibility between the coarse stage and the fine stage through the first cord.

In one embodiment, the apparatus also includes a second cord which also has a first end and a second end, as well as a central axis that is substantially aligned along the first axis. When the first actuator causes the coarse stage to accelerate in the second direction, the second cord is substantially stiff between the coarse stage and the fine stage such that the second cord enables a relatively high transmissibility between the coarse stage and the fine stage through the second cord, whereas when the first actuator causes the coarse stage to accelerate in the first direction, the second cord is substantially slack between the coarse stage and the fine stage such that the second cord enables a relatively low transmissibility between the coarse stage and the fine stage through the second cord. In such an embodiment, the first and second cords are each arranged to be substantially slack when the coarse stage is not accelerating.

According to yet another aspect of the present invention, a positioning apparatus includes a first stage that is movable along at least one axis, and a first driving device that is coupled to the first stage to move the first stage along the axis. A second stage, which is movable with the first stage along the axis, is coupled to a second driving device that moves the second stage relative to the first stage. A transmitter, which is disposed between the first stage and the second stage, transmit force between the first stage and the second stage. When the first driving device accelerates the first stage along the axis, the transmitter transmits the force such that the first stage effectively pulls, or provides a pulling force, on the second stage from a direction of movement of the second stage. Additionally, when at least one of a first speed of the first stage and a second speed of the second stage is substantially constant, the second driving device moves the second stage to position the second stage at a desired position.

In accordance with still another aspect of the present invention, a method for positioning an object includes accelerating a first stage along at least one axis, and accelerating a second stage with the first stage along the axis by transmitting force between the first stage and the second stage through the use of a transmitter. The method also includes positioning the second stage by utilizing a driving device that moves the second stage relative to the first stage when at least one of a first speed of the first stage and a second speed of the second stage is constant. The transmitter transmits the force such that the first stage acts as a pulling force on the second stage from a direction of movement of the second stage.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Figure 1:
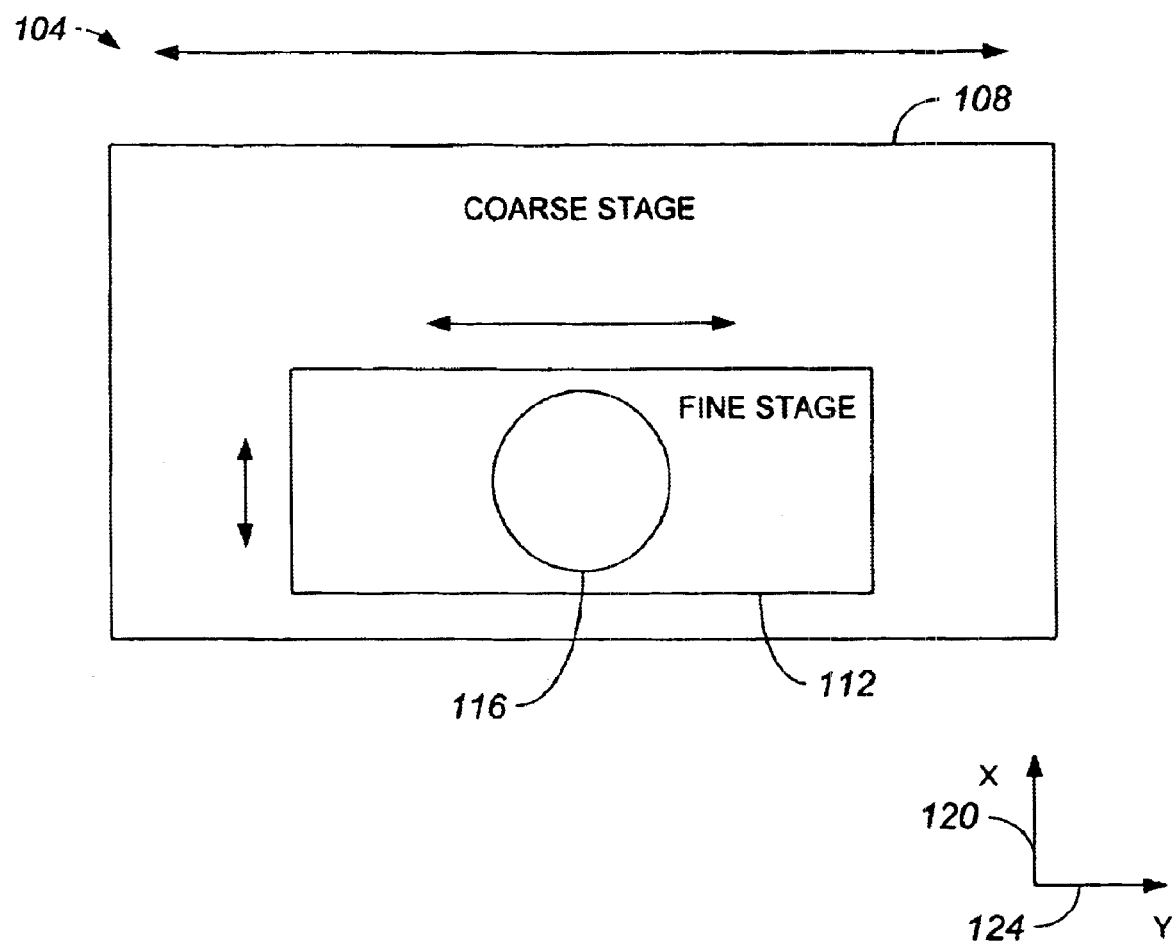
FIG. 1 is a diagrammatic block diagram representation of reticle positioning stage.

Increasing the throughput requirements of a reticle scanning stage often requires that acceleration capabilities of the reticle scanning stage be increased, and causes the accuracy associated with the reticle scanning stage to be compromised. This compromise is due at least in part to the fact that actuators which are capable of higher accelerations are generally more difficult to control and, hence, less accurate. In addition to being less accurate, large actuators are also difficult to position such that a line of force associated with the actuators may cross through the center of gravity on the reticle scanning stage. When the line of force is not through the center of the center of gravity on the reticle scanning stage, then a fairly significant balancing mass which increases the overall size of the reticle scanning stage may be needed to balance the reticle scanning stage. In order to increase the accuracy associated with a reticle scanning stage and to substantially minimize the size of the reticle scanning stage, smaller, more controllable actuators may be used with the reticle scanning stage, typically at the expense of acceleration capabilities.

As will be appreciated by those skilled in the art, during a scan, high accuracy is generally only important in a zero acceleration portion of a scan trajectory. That is, when a coarse stage of an overall reticle scanning stage is accelerating, high accuracy is typically relatively unimportant. Therefore, high acceleration is effectively only applied when accuracy requirements are relatively low, while high accuracy is generally only needed when high acceleration is not applied.

A dual force mode fine stage that is a part of an overall reticle scanning stage of the present invention is highly controllable and capable of high accelerations. A dual force mode fine stage may be arranged such that it is coupled, but not rigidly coupled, to a coarse stage along a center line associated with a reticle positioned on the fine stage. The coupling may be made, in one embodiment, using cords which couple opposite sides of the fine stage to the coarse stage. The cords may be arranged such that as the coarse stage accelerates, the fine stage, which has associated low force actuators, effectively lags behind the coarse stage until the appropriate cord is pulled into a tensioned stage. In tension, the cord may function as a stiff connection between the coarse stage and the fine stage. While the cord is a stiff connection, the high acceleration of the coarse stage causes the fine stage to accelerate as well without requiring the existence of a high force actuator which substantially directly acts on the fine stage.

Once the coarse stage has effectively dragged the fine stage to an appropriate location, e.g., once the scan portion of a trajectory is reached, the acceleration of the coarse stage drops to zero, and the tension in the cord which was in tension during the acceleration of the coarse stage is removed. That is, the cord is placed in a slack or loose state. Once the cord is in a loose state, the fine stage may be precisely or accurately controlled using the low force actuators. As the fine stage is already in the vicinity of a desired scanning location, positioning the fine stage generally does not require the application of high accelerations.

The use of a dual force mode fine stage which effectively has two modes, namely a high acceleration mode with low accuracy and a low acceleration mode with high accuracy, enables the size, e.g., mass, of the overall stage which includes the fine stage to be substantially minimized. This minimization of size is possible since the use of relatively large actuators which move the fine stage on which a reticle is positioned may be eliminated. Further, enabling smaller actuators to move the fine stage increases the ability to position the smaller actuators such that the line of force associated with accelerating the fine stage may pass through the center of the reticle, thereby reducing the amount of mass needed to valance the overall stage.

By minimizing the size of the overall stage, the bandwidth associated with controlling the fine stage may be increased. That is, the fine stage may be more precisely controlled. Typically, the smaller the size of an overall stage, the higher the resonance frequency associated with the overall stage. In general, higher resonance frequencies may be controlled with a higher servo bandwidth. Using smaller actuators as opposed to larger actuators also reduces the mass of the actuator and the amount of power consumed by the overall stage, as well as the cost associated with building and maintaining the overall stage.

Figure 2A:
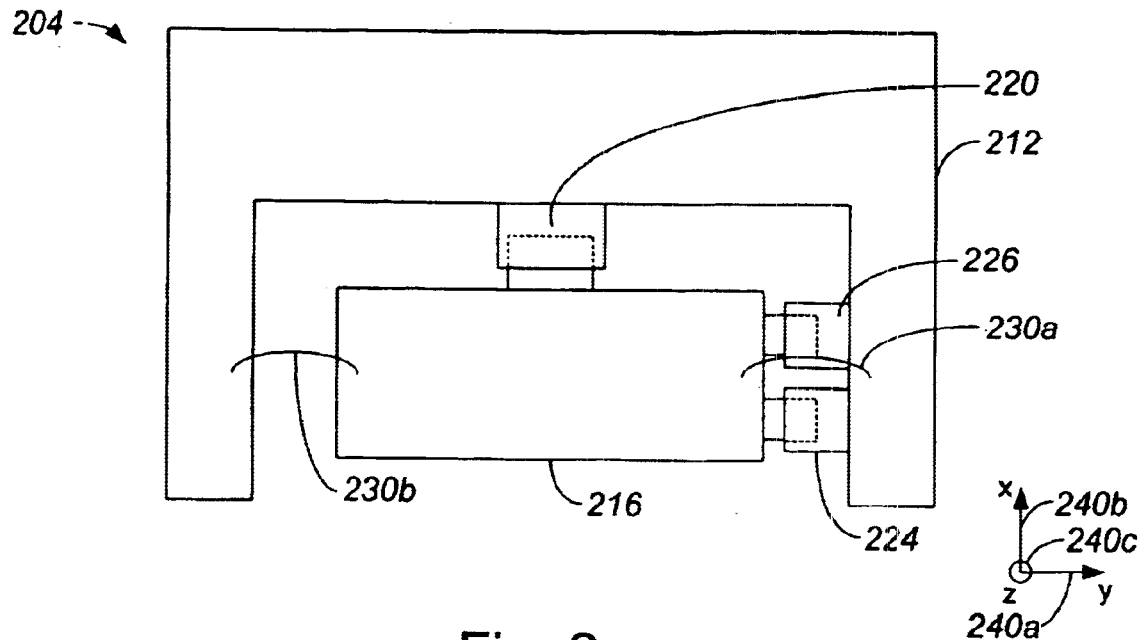
FIG. 2a is a diagrammatic representation of a coarse stage and a fine stage in accordance with an embodiment of the present invention.
Figure 3A:
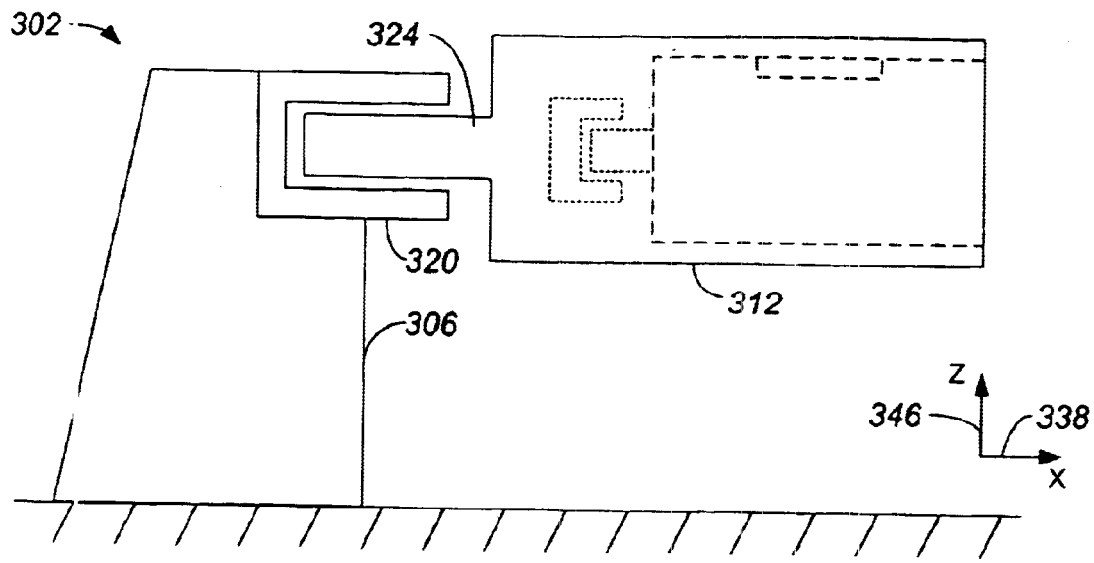
FIG. 3a is a diagrammatic side-view representation of an overall reticle scanning stage device in accordance with an embodiment of the present invention.
Figure 3B:
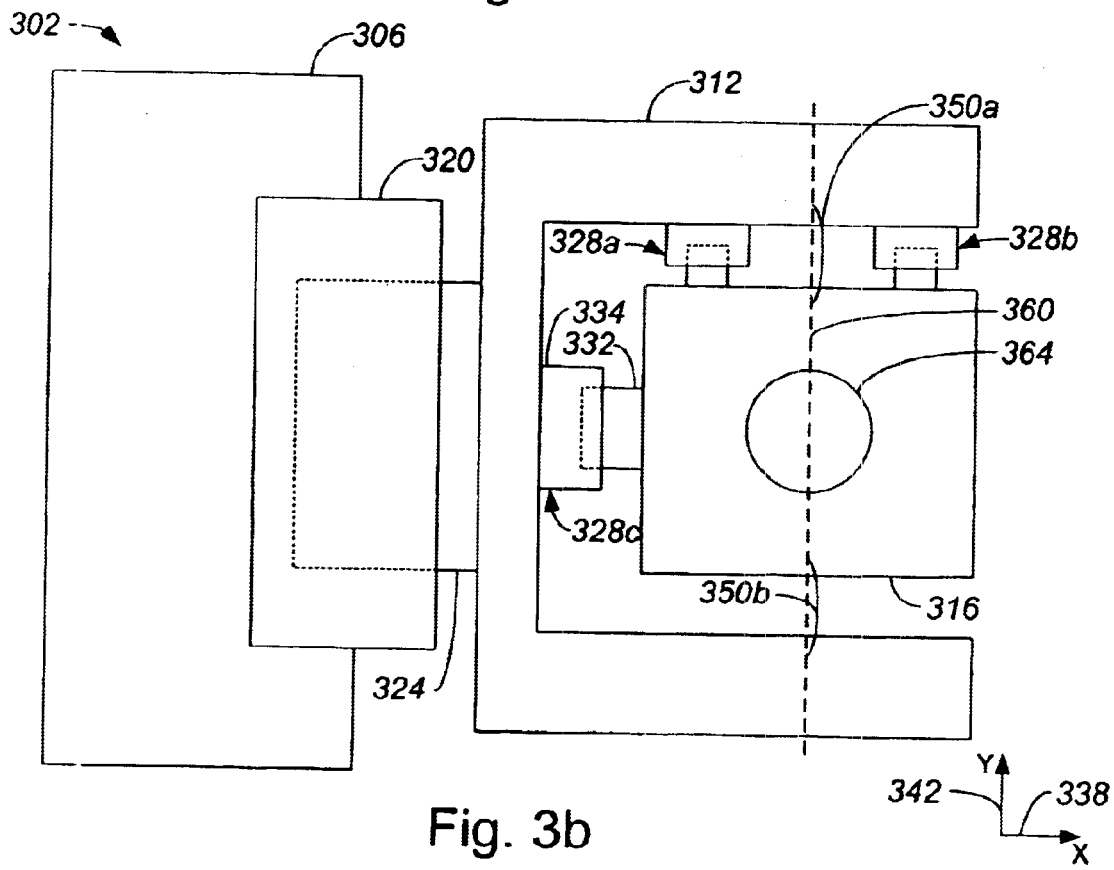
FIG. 3b is a diagrammatic top-view representation of an overall reticle scanning stage device, i.e., reticle scanning stage 302 of FIG. 3a, in accordance with an embodiment of the present invention.

With reference to FIG. 2a, a scanning stage which has dual force mode capabilities will be described in accordance with an embodiment of the present invention. A scanning stage 204 includes a coarse stage 212 and a fine stage 216. Coarse stage 212 is arranged to move, e.g., accelerate, along a y-axis 240a using an actuator (not shown). An actuator used to move coarse stage 212, as will be described below with respect to FIGS. 3a and 3b, is typically a high force, relatively high weight, and relatively bulky actuator.

Through the use of cords 230, coarse stage 212 may pull fine stage 216 and cause fine stage 216 to accelerate along with coarse stage 212. As such, the motion of fine stage 216 during a high acceleration, low accuracy force mode is affectively achieved using substantially only coarse stage 212 and one of cords 230. Hence, the use of a dedicated, relatively large, high force actuator to provide fine stage 216 with a high acceleration may be eliminated.

When coarse stage 212 accelerates in a positive direction along y-axis 240a, cord 230a is pulled taut, e.g., becomes stiff, and enables a high transmissibility between coarse stage 212 and fine stage 216. Further, when cord 230a is taut, fine stage 216 is substantially directly and relatively rigidly coupled to coarse stage 212 such that fine stage 216 accelerates along with coarse stage 212 in a positive direction along y-axis 240a. Similarly, when cord 230b is taut, the transmissibility between coarse stage 212 and fine stage 216 is relatively high through cord 230b, and both coarse stage 212 and fine stage 216 accelerate in a negative direction with respect to y-axis 240a.

As shown, cords 230 are shown as being positioned atop coarse stage 212 and fine stage 216. It should be appreciated, however, that cords 230 may instead be positioned on facing sides of coarse stage 212 and fine stage 216 such that cords 230 do not overlap coarse stage 212 and fine stage 216. In general, cords may also be positioned such that cords are coupled to bottom sides of coarse stage 212 and fine stage 216.

In order to enable fine stage 216 to move or accelerate independently from coarse stage 220, cords 230 may both be in a substantially slackened, or loose, state. Actuator 220, 224, 226 may then be used to move or accelerate fine stage 216. Actuators 220, 224, 226 are arranged to function during a low acceleration, high accuracy force mode, i.e., when there is substantially no tension in cords 230 and acceleration of coarse stage 212 is dropped to approximately zero. Typically, actuators 220, 224, 226 are relatively low force, relatively light, and precisely controllable. In one embodiment, actuators 220, 224, 226 may be voice coil motors, as voice coil motors are linear force motors that are relatively small, and relatively easy to control.

Fine stage 216 maybe positioned with respect to y-axis 240a, an x-axis 240b, and a z-axis 240c. Specifically, actuator 220 may precisely position fine stage 216 along x-axis 240b, while actuator 224 and actuator 226 may each precisely position fine stage 216 along y-axis 240a. As will be appreciated by those skilled in the art, differential control of actuator 224 and actuator 226, such that a "delta" is created, may precisely position fine stage about z-axis 240c. In other words, actuator 220 may be controlled to adjust position along x-axis 240b, while actuator 224 and actuator 226 may be controlled to adjust position along y-axis 240a as well as rotation about z-axis 240c.

Figure 2B:
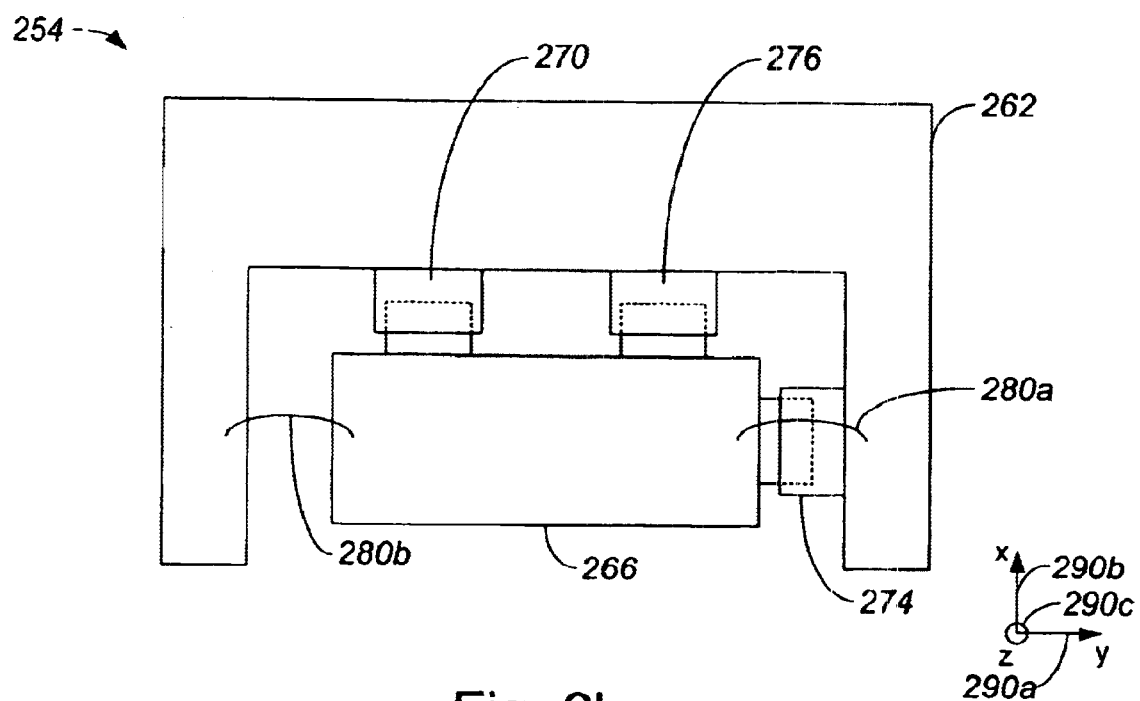
FIG. 2b is a diagrammatic representation of a coarse stage and a fine stage in accordance with another embodiment of the present invention.

The position of actuators that are used to finely tune the position of a fine stage may vary. As shown in FIG. 2a, actuator 224 and actuator 226 which control position along y-axis 240a as well as position about z-axis 240c are positioned substantially adjacently with respect to x-axis 240b. FIG. 2b is a diagrammatic representation of a dual force mode scanning stage in which the position of actuators differs from the position of actuators shown in FIG. 2a in accordance with another embodiment of the present invention. A scanning stage 254 includes a coarse stage 262 and a fine stage 266 which may be directly coupled by one of cords 280 when one of cords 280 is taut. The position of fine stage 266 may be controlled by actuators 270, 274, 276, which are arranged such that actuator 270 and actuator 276 which control linear motion of fine stage 266 along a x-axis 290b in addition to rotational motion of fine stage 266 about a z-axis 290c, are substantially adjacent to one another with respect to x-axis 290b. Actuator 274, which controls linear motion of fine stage 266 along an y-axis 290a, is not positioned adjacently to actuator 270 and actuator 276 with respect to x-axis 290b.

Referring next to FIGS. 3a and 3b, one embodiment of an overall reticle scanning device which includes a coarse stage and a fine stage will be described in accordance with an embodiment of the present invention. FIG. 3a is a diagrammatic side-view representation of a reticle scanning device 302, while FIG. 3b is a diagrammatic top-view representation of reticle scanning device 302. Reticle scanning device 302 includes a base 306, a coarse stage 312, and a fine stage 316. Base 306 is coupled to a magnet track 320 within which an extension 324 (including a conductor array) of coarse stage 312 moves. That is, magnet track 320 and extension 324 cooperate to effectively act as an actuator (for example, a linear motor utilizing a Lorentz force) which is capable of accelerating coarse stage 312. The actuator which includes magnet track 320 and extension 324 is generally a high force actuator which has a relatively large size, and may consume a relatively large amount of power. In one embodiment, the magnet track 320 and extension 324 operate as part of a relatively high efficiency, high force actuator.

As discussed above with respect to FIGS. 2a and 2b, fine stage 316 may be accelerated, once coarse stage 312 is no longer accelerating, using linear motors 328, e.g., voice coil motors. Motors 328 generally include movers and forcers, as will be appreciated by those skilled in the art. A mover 332 of a motor, e.g., motor 328c, is generally coupled to fine stage 316, while a forcer 334 is generally coupled to coarse stage 312. The use of motors 328 provides a link between coarse stage 312 and fine stage 316, and enables fine stage 316 to have three degrees of freedom. In the described embodiment, the three degrees of freedom associated with fine stage 316 are linear motion along an x-axis 338, linear motion along a y-axis 342, and rotational motion about a z-axis 346. That is, fine stage 316 may translate with respect to x-axis 338 and y-axis 342, and rotate about z-axis 346.

Cords 350 are arranged to each be coupled at one end to coarse stage 312 and another end to fine stage 316. As shown, cords 350 may be positioned to coincide with a line of force 360 which passes substantially though the center of gravity of fine stage 316. Force is typically applied to fine stage 316 through cords 350 at line of force 360. In one embodiment, line of force 360, in addition to passing through the center of reticle 364, passes through the overall center of gravity of device 302, or through the center of gravity of portions of device 302 which move. Each cord 350 is such that when fine stage 316 is at equilibrium with coarse stage 312, e.g., when coarse stage 312 and fine stage 316 are at rest such that fine stage 316 is substantially centered with respect to coarse stage 312, each cord 350 is in a slack or loose state.

Cord 350a may be considered to be a "positive y-acceleration" cord, or a leading cord, as cord 350a is arranged to be in tension when coarse stage 312 accelerates in a positive direction with respect to y-axis 342. Conversely, cord 350b may be considered to be a "negative y-acceleration" cord, or trailing cord, as cord 350a is arranged to be in tension when coarse stage 312 accelerates in a negative direction with respect to y-axis 342. Both cords 350 are aligned along y-axis 342 such that a central axis of each of cords 350 is substantially parallel to y-axis 342.

The length of cords 350 may vary depending upon the requirements associated with reticle stage device 302, and is often chosen such that cord 350a has substantially the same length as cord 350b, although it should be appreciated that cord 350a and cord 350b may be of different lengths. In general, the length of cord 350 is chosen to be long enough not to have a significant amount of stiffness while in a slackened state, and long enough to support the necessary movement of fine stage 316 along x-axis 338. Like the length of cords 350, the diameter of cords 350 may also vary, depending upon the material from which cords 350 are formed, as well as the desired stiffness in cords 350 when cords 350 are tensioned. Typically, the dimensions of cords 350 may be chosen such that cords 350 are as small as possible, while the materials from which cords 350 are formed may be substantially any suitable material, e.g., a material with fiber-like qualities. That is, cords 350 may be fabricated from a material that is relatively soft, and has a relatively high stiffness in tension and a relatively low stiffness in compression.

Cords 350 may generally be configured such that when cords 350 are at equilibrium, i.e., when fine stage 316 is effectively centered with respect to coarse stage 312, as shown, cords 350 are in a slightly loosened state. In other words, cords 350 may be sized such that cords 350 are relatively close to being in a tensioned state when the position of fine stage 316 is substantially centered with respect to coarse stage 312.

When cords 350 are in tension, vibrations may be transmitted between coarse stage 312 and fine stage 316 through cords 350. The transmission of vibrations to fine stage 316 when coarse stage 312 is accelerating generally does not affect the scanning of reticle 364 positioned on fine stage 316. However, the transmissibility associated with cords 350 may be an issue of vibrations are transmitted through cords 350 while coarse stage 312 is not accelerating, and fine stage 316 is being used to scan reticle 364.

The transmissibility of cords 350 is generally associated with the looseness of cords 350, or the slack in cords 350. Typically, cords 350 have less transmissibility when loose than they do when they are in tension. In general, the overall amount of transmissibility in cords 350 is preferably minimized. Hence, the dimensions of cords 350 may be chosen such that when cords 350 are in a loose state, transmissibility in cords 350 is at a level that does not significantly affect the accuracy of a scanning process, while when cords 350 are tensioned, cords 350 serve as a relatively strong direct coupling between coarse stage 312 and fine stage 316.

As described above, cords which effectively provide a coupling between a fine stage and a coarse stage may alternately be in loosened states, e.g., slacked, or in tightened states, e.g., tensioned. That is, cords may be such that both cords are slacked, or one cord is slacked while the other is tightened. The disposition of the cords at any given time is dependent at least in part upon the motion of the coarse stage. Specifically, the disposition of the cords may be dependent upon the direction in which the coarse stage is accelerating.

Figure 4:
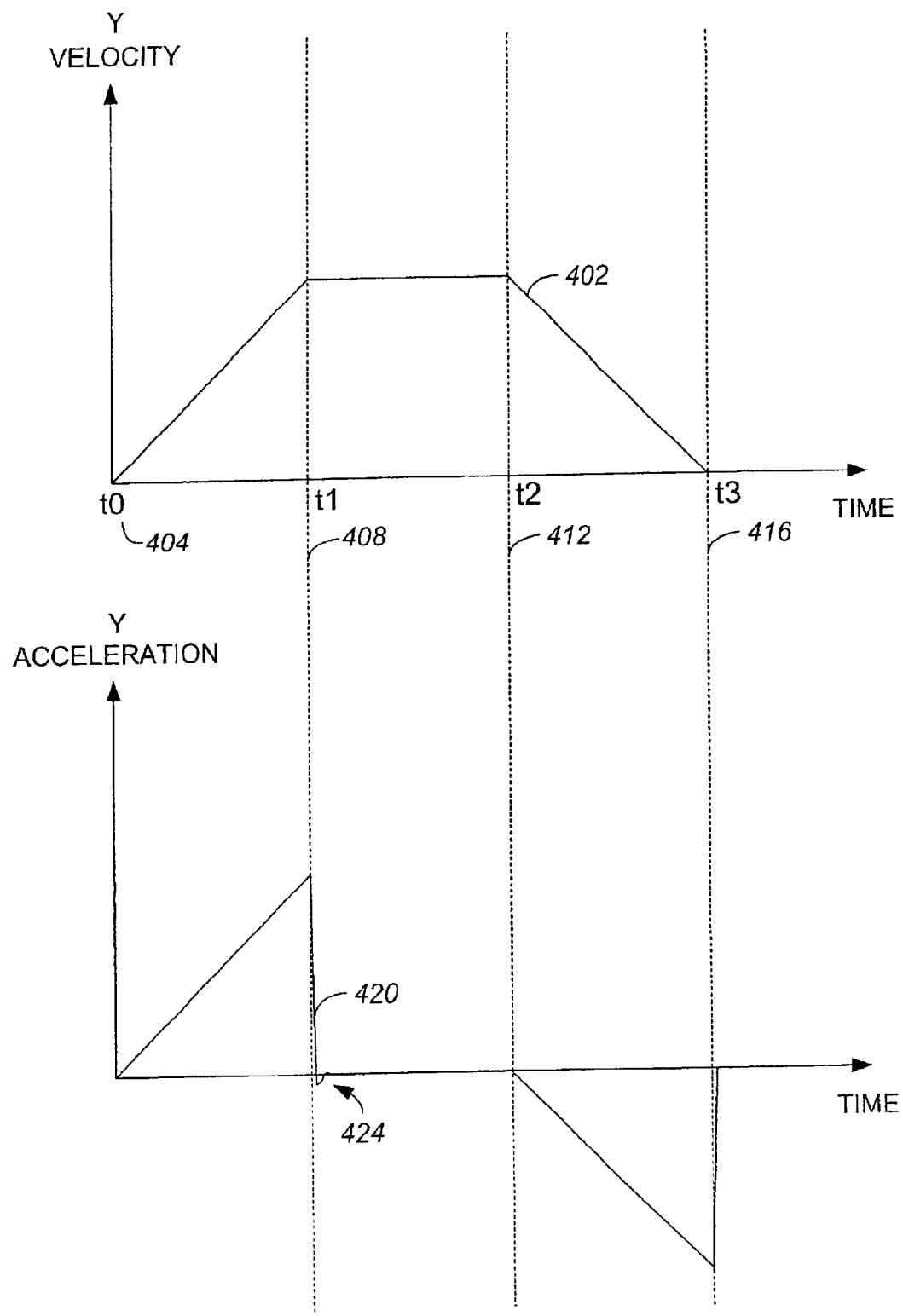
FIG. 4 is a graphical representation of a velocity and an acceleration as a function of time for a coarse stage that is used in a reticle scanning process in accordance with an embodiment of the present invention.

When a coarse stage accelerates, e.g., in a positive direction, the coarse stage generally accelerates until a reticle reaches the vicinity of a desired position. Once the reticle is positioned near the desired position, the coarse stage typically stops accelerating such that the coarse stage may effectively maintain a constant velocity or a constant position. In order to move the reticle back to a home or rest position, the coarse stage is accelerated, e.g., in a negative direction, until the reticle reaches the home position, at which time the acceleration is stopped. FIG. 4 is a graphical representation of a velocity of a coarse stage and an acceleration of a coarse stage as a function of time for one scan in accordance with an embodiment of the present invention. A velocity trajectory 402 of a coarse stage varies such that the velocity increases substantially linearly from a zero velocity at time t0 404 to a target or desired velocity at time t1 408. The target velocity may generally be a velocity maintained by the coarse stage while the fine stage scans.

Velocity 402 of the coarse stage moves from a zero velocity to a target position as the coarse stage accelerates. An acceleration trajectory 420 of the coarse stage is shown as increasing linearly in a positive direction between time t0 404 and time t1 408. It should be appreciated, however, that the coarse stage may instead have a constant acceleration. In one embodiment, the coarse stage may have an acceleration that increases linearly until a desired acceleration is reached, at which time the acceleration becomes a constant acceleration.

Once the target velocity of the coarse stage is reached at time t1 408, the target velocity is maintained from time t1 408 t0 a time t2 412. Between time t1 408 and time t2 412, the fine stage which is coupled to the coarse stage scans. In order to maintain the target velocity of the coarse stage, acceleration 420 drops effectively to a zero level at time t1 408, and remains at a substantially zero level until time t2 412. As will be understood by those skilled in the art, when acceleration 420 drops to zero, there may be some settling time before acceleration 420 settles at substantially zero, as shown at 424.

At time t2 412, which may correspond to a time at which a scan using a fine stage is completed, acceleration 420 increases linearly in a negative direction. Velocity 402 decreases substantially linearly from a target velocity to a zero velocity. Once the zero velocity, or an approximately zero velocity, is reached at a time t3 416, acceleration 420 is stopped. That is, the coarse stage ceases to accelerate one a zero velocity is reached. In one embodiment, rather than reaching a zero velocity, the coarse stage may instead reach a second target velocity.

Figure 5A:
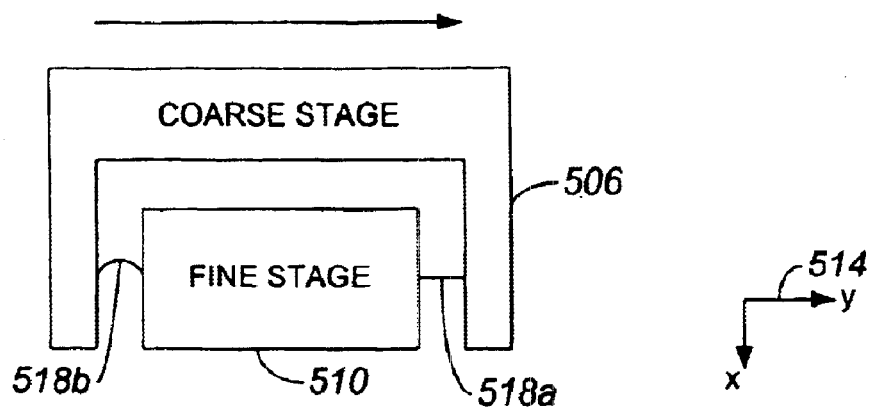
FIG. 5a is a diagrammatic representation of a coarse stage and a fine stage when the coarse stage is accelerating in a positive y-direction in accordance with an embodiment of the present invention.
Figure 5B:
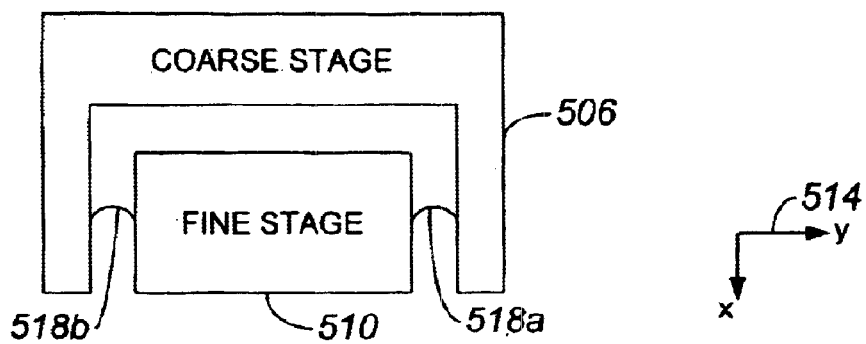
FIG. 5b is a diagrammatic representation of a coarse stage and a fine stage, i.e., coarse stage 506 and fine stage 510 of FIG. 5a, when the coarse stage is either moving at a constant velocity in a positive y-direction or in a stationary position in accordance with an embodiment of the present invention.
Figure 5C:
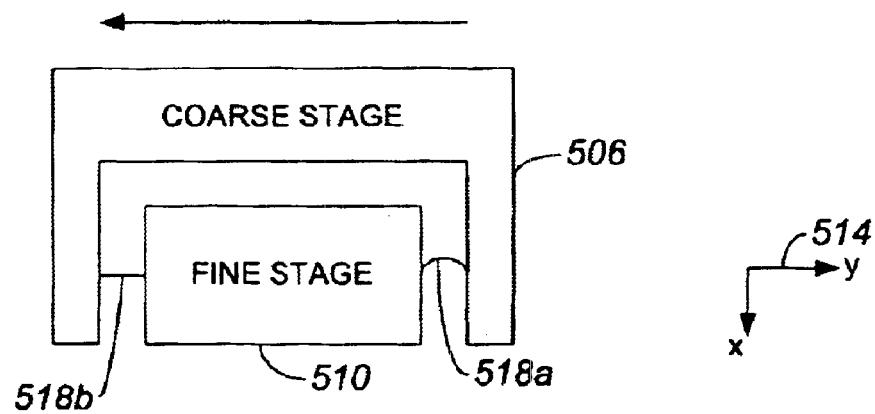
FIG. 5c is a diagrammatic representation of a coarse stage and a fine stage, i.e., coarse stage 506 and fine stage 510 of FIG. 5a, when the coarse stage is accelerating in a negative y-direction in accordance with an embodiment of the present invention.

With reference to FIGS. 5a–c, the disposition of cords which serve to couple a coarse stage to a fine stage will be described in accordance with an embodiment of the present invention. As shown in FIGS. 5a–c, a coarse stage 506 and a fine stage 510, which may each be part of an overall reticle scanning stage, are arranged to move along a y-axis 514. Fine stage 510 is coupled to coarse stage 506 through cords 518, as discussed above.

FIG. 5a is a diagrammatic representation of cords 518 when coarse stage 506 and, hence, fine stage 510 accelerate in a positive direction along y-axis 514. That is, FIG. 5a is a diagrammatic representation of cords 518 during positive acceleration As shown, a positive y-acceleration cord 518a is in tension, while a negative y-acceleration cord 518b is loose, while coarse stage 506 accelerates in a positive direction. When positive y-acceleration cord 518a is in tension, or is taut, positive y-acceleration cord 518a effectively acts as a rigid coupling between coarse stage 506 and fine stage 510. Therefore, fine stage 510 effectively accelerates with coarse stage 506, and the transmissibility of forces and vibrations between coarse stage 506 and fine stage 510 is relatively high. The transmission of vibrations from coarse stage 506 to fine stage 510 through positive y-acceleration cable 518a during acceleration of coarse stage 506 does not significantly affect the performance of fine stage 510, as fine stage 510 is not positioned to perform any scanning of a reticle positioned thereon while coarse stage 506 accelerates.

When positive y-acceleration cord 518a is taut or in tension, fine stage 510 is essentially dragged along y-axis 514 by coarse stage 506. When coarse stage 506 is no longer accelerating, e.g., when coarse stage 506 is stopped, positive y-acceleration cord 518a becomes loose, as shown in FIG. 5b. When coarse stage 506 is first stopped, as for example when the vicinity of a desired position is reached, fine stage 510 may continue to move along y-axis 514 until substantially all effects of the positive y-acceleration have subsided, i.e., until the momentum in fine stage 510 which may be attributed to movement of coarse stage 506 is substantially dissipated. Both positive y-acceleration cord 518a and negative y-acceleration cord 518b are generally both in a loose state.

Once coarse stage 506 is no longer accelerating, e.g., either stopped or moving at a constant velocity, fine stage 510 may move such that at least one of cords 518 is in tension at least temporarily. However, in general, when coarse stage 506 is not accelerating, i.e., between time t1 408 and time t2 412 of FIG. 4, both cords 518 are at least somewhat loose.

When coarse stage 506 is to move along y-axis 514 in a negative direction, fine stage 510 is pulled by coarse stage 506 using negative y-acceleration cord 518b. As indicated in FIG. 5c, when coarse stage 506 accelerates along y-axis 514 in a negative direction, negative y-acceleration cord 518b is eventually pulled into tension by coarse stage 506. At the same time, positive y-acceleration cord 518a remains loose.

In general, a coarse stage accelerates to position a reticle near a first desired position, at which time the fine stage moves the reticle closer to the first desired position. Once a beam has been projected through the reticle at the first desired position, the coarse stage may accelerate to position the reticle near a second desired position. When the reticle is at the second desired position, the fine stage then moves the reticle closer to the second desired position. The coarse stage and the fine stage may thus cooperate to scan the reticle during an overall etching or patterning process. When the etching or patterning process is completed, the coarse stage may then move the reticle back to a home position.

Figure 6:
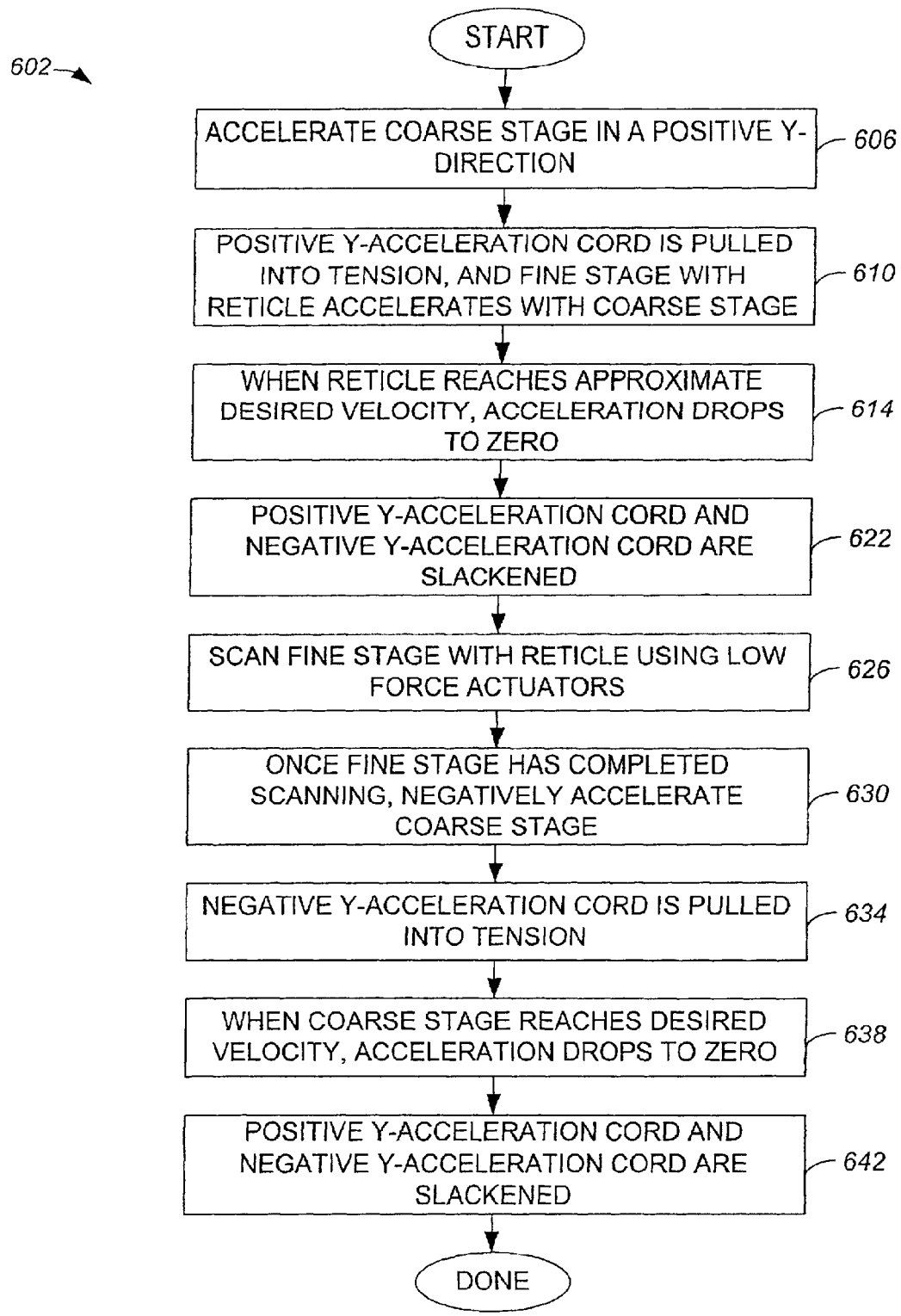
FIG. 6 is a process flow diagram which illustrates the steps associated with one scan of a reticle in accordance with an embodiment of the present invention.

Referring next to FIG. 6, the operation of an overall reticle scanning stage will be described in accordance with an embodiment of the present invention. That is, the steps associated with positioning a reticle using a coarse stage and a dual force mode fine stage which are coupled using a cable or a cord for one scan will be described. A process of 602 of operating a scanning stage begins at step 606 in which a coarse stage is accelerated in a positive y-direction to provide the coarse stage with velocity to move the coarse stage, for example, from a default, or home, position to a desired position. The coarse stage may be accelerated through the use of a relatively high force actuator, or a motor such as a linear motor, as described above with respect to FIGS. 3a and 3b. When the coarse stage accelerates, the coarse stage effectively moves a fine stage along with it. In the described embodiment, the fine stage is moved by the coarse stage through the use of a low force actuator and a cord.

Once the coarse stage begins to accelerate in a positive y-direction, the positive y-acceleration cord that serves as a substantially direct tie between the coarse stage and the fine stage is pulled into tension in step 610. In other words, the y-acceleration cord serves as a relatively stiff connection between the coarse stage and the fine stage. As the fine stage is pulled by the coarse stage through a positive y-acceleration cord, a reticle which is supported by the fine stage is pulled as well. Generally, when the positive y-acceleration cord is in tension, a negative y-acceleration cord is slackened or relatively loose, as described above with respect to FIG. 5a.

When the reticle reaches an approximate desired velocity, , the acceleration of the coarse stage drops to approximately zero in step 614, and the coarse stage, in the described embodiment, moves at a constant velocity. As will be appreciated by those skilled in the art, once the coarse stage stops accelerating, there may be some settling time before the coarse stage actually stops accelerating or settles at the constant velocity. After the coarse stage stops accelerating or settles at the constant velocity, the positive y-acceleration cord and the negative y-acceleration cord are both slackened in step 622, and the fine stage scans or positions the reticle in step 626 using the low force actuators. Scanning or positioning the reticle using the low force actuators may include adjusting the position of the reticle to account for, for instance, loading inaccuracies. In general, once the position of the reticle is adjusted, either the fine stage may scan the reticle, or the coarse stage may effectively scan the reticle at a constant velocity while the fine stage does not move independently of the coarse stage.

Eventually, when a pattern on the reticle has been successfully projected onto a wafer during the scan, the positioning of the reticle that is performed by the fine stage is completed, in the described embodiment. As such, the coarse stage is negatively accelerated in a y-direction in step 630 to return the coarse stage and, hence, the fine stage to a zero velocity. As the coarse stage negatively accelerates in a y-direction, the negative y-acceleration cord is pulled into tension in step 634 such that the negative y-acceleration cord serves as a relatively stiff connection between the coarse stage and the fine stage. Once the coarse stage reaches a zero velocity, or, more generally, another desired velocity, the acceleration of the coarse stage is dropped to zero in step 638. When the acceleration of the coarse stage reaches zero, the positive y-acceleration cord and the negative y-acceleration cord are both slackened in step 642, and the process of operating a scanning stage is completed.

Figure 7:
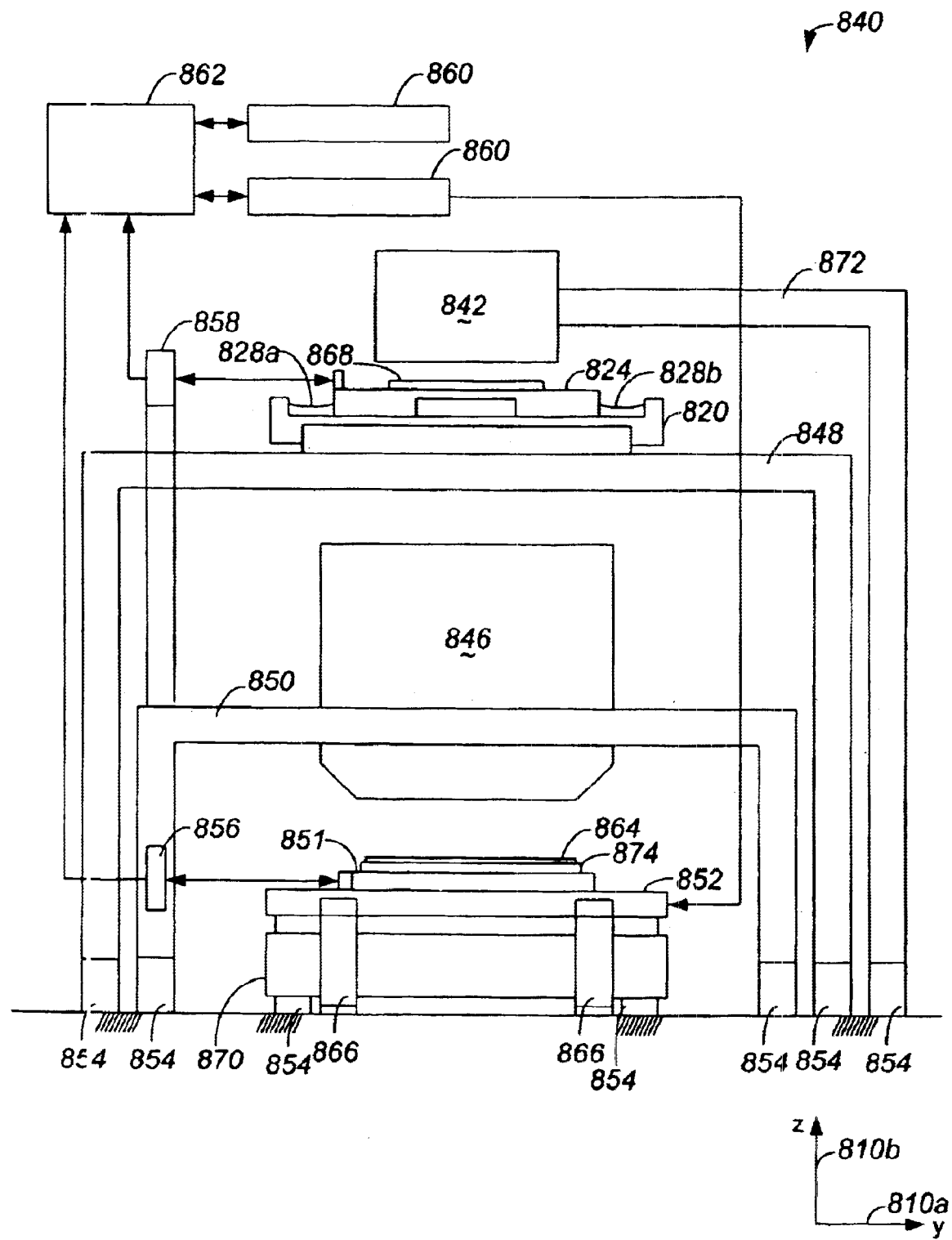
FIG. 7 is a diagrammatic representation of a photolithography apparatus which includes a scanning stage with a dual force mode fine stage in accordance with an embodiment of the present invention.

As mentioned above, an overall reticle scanning stage device with dual force mode capabilities may be used as a part of a photolithography apparatus. With reference to FIG. 7, a photolithography apparatus which includes an overall reticle scanning stage device with dual force mode capabilities will be described in accordance with an embodiment of the present invention. A photolithography apparatus (exposure apparatus) 840 includes a wafer positioning stage 852 that may be driven by a planar motor (not shown), as well as a wafer table 851 that is magnetically coupled to wafer positioning stage 852. It should be appreciated that, in one embodiment, wafer positioning stage 852 may include a wafer coarse stage and a wafer fine stage which include dual force mode capabilities similar to those described above for a reticle scanning stage.

The planar motor which drives wafer positioning stage 852 generally uses an electromagnetic force generated by magnets and corresponding armature coils arranged in two dimensions. A wafer 864 is held in place on a wafer holder 874 which is coupled to wafer table 851. Wafer positioning stage 852 is arranged to move in multiple degrees of freedom, e.g., between three to six degrees of freedom, under the control of a control unit 860 and a system controller 862. The movement of wafer positioning stage 852 allows wafer 864 to be positioned at a desired position and orientation relative to a projection optical system 846.

Wafer table 851 may be levitated in a z-direction 810b by any number of voice coil motors (not shown), e.g., three voice coil motors. In the described embodiment, at least three magnetic bearings (not shown)couple and move wafer table 851 along a y-axis 810a. The motor array of wafer positioning stage 852 is typically supported by a base 870. Base 870 is supported to a ground via isolators 854. Reaction forces generated by motion of wafer positioning stage 852 may be mechanically released to a ground surface through a frame 866. One suitable frame 866 is described in JP Hei 8-166475 and U.S. Pat. No. 5,528,118, which are each herein incorporated by reference in their entireties.

An illumination system 842 is supported by a frame 872. Frame 872 is supported to a ground via isolators 854. Illumination system 842 includes an illumination source, and is arranged to project a radiant energy, e.g., light, through a mask pattern on a reticle 868 that is supported by and scanned using a reticle stage which includes a coarse stage 820 and a fine stage 824. The radiant energy is focused through projection optical system 846, which is supported on a projection optics frame 850 and may be released to the ground through isolators 854. Coarse stage 820 and fine stage 824 are connected by cords 828 which enable fine stage 824 to accelerate with coarse stage 820 in y-direction 810a, as described above. Specifically, when a linear motor 832 causes coarse stage 820 to accelerate in y-direction 810a, one of cords 828 is pulled into tension by the acceleration of coarse stage 820 to cause fine stage 824 to accelerate. For instance, when acceleration is in a positive y-direction 810a, then cord 828b may be pulled into tension. Alternatively, when acceleration is in a negative y-direction 810a, then cord 828a may be pulled into tension. A stator of linear motor 832 is connected to a reticle stage frame 848, therefore reaction forces generated by motion of coarse stage 820 and fine stage 824 may be mechanically released to a ground surface through isolators 854. Suitable isolators 854 include those described in JP Hei 8-330224 and U.S. Pat. No. 5,874,820, which are each incorporated herein by reference in their entireties.

A first interferometer 856 is supported on projection optics frame 850, and functions to detect the position of wafer table 851. Interferometer 856 outputs information on the position of wafer table 851 to system controller 862. A second interferometer 858 is supported on projection optics frame 850, and detects the position of coarse stage 820 and, in one embodiment, fine stage 824. Interferometer 858 also outputs position information to system controller 862.

It should be appreciated that there are a number of different types of photolithographic apparatuses or devices. For example, photolithography apparatus 840, or an exposure apparatus, may be used as a scanning type photolithography system which exposes the pattern from reticle 868 onto wafer 864 with reticle 868 and wafer 864 moving substantially synchronously. In a scanning type lithographic device, reticle 868 is moved perpendicularly with respect to an optical axis of a lens assembly (projection optical system 846) or illumination system 842 by coarse stage 820 and fine stage 824. Wafer 864 is moved perpendicularly to the optical axis of projection optical system 846 by a positioning stage 852. Scanning of reticle 868 and wafer 864 generally occurs while reticle 868 and wafer 864 are moving substantially synchronously.

Alternatively, photolithography apparatus or exposure apparatus 840 may be a step-and-repeat type photolithography system that exposes reticle 868 while reticle 868 and wafer 864 are stationary, e.g., when neither a fine stage 820 nor a coarse stage 824 is moving. In one step and repeat process, wafer 864 is in a substantially constant position relative to reticle 868 and projection optical system 846 during the exposure of an individual field. Subsequently, between consecutive exposure steps, wafer 864 is consecutively moved by wafer positioning stage 852 perpendicularly to the optical axis of projection optical system 846 and reticle 868 for exposure. Following this process, the images on reticle 868 may be sequentially exposed onto the fields of wafer 864 so that the next field of semiconductor wafer 864 is brought into position relative to illumination system 842, reticle 868, and projection optical system 846.

It should be understood that the use of photolithography apparatus or exposure apparatus 840, as described above, is not limited to being used in a photolithography system for semiconductor manufacturing. For example, photolithography apparatus 840 may be used as a part of a liquid crystal display (LCD) photolithography system that exposes an LCD device pattern onto a rectangular glass plate or a photolithography system for manufacturing a thin film magnetic head. Further, the present invention may also be applied to a proximity photolithography system that exposes a mask pattern by closely locating a mask and a substrate without the use of a lens assembly. Additionally, the present invention provided herein may be used in other devices including, but not limited to, other semiconductor processing equipment, machine tools, metal cutting machines, and inspection machines.

The illumination source of illumination system 842 may be g-line (436 nanometers (nm)), i-line (365 nm), a KrF excimer laser (248 nm), a ArF excimer laser (193 nm), and an $F_2$-type laser (157 nm). Alternatively, illumination system 842 may also use charged particle beams such as x-ray and electron beams. For instance, in the case where an electron beam is used, thermionic emission type lanthanum hexaboride ($LaB_6$) or tantalum (Ta) may be used as an electron gun. Furthermore, in the case where an electron beam is used, the structure may be such that either a mask is used or a pattern may be directly formed on a substrate without the use of a mask.

With respect to projection optical system 846, when far ultra-violet rays such as an excimer laser is used, glass materials such as quartz and fluorite that transmit far ultra-violet rays is preferably used. When either an $F_2$-type laser or an x-ray is used, projection optical system 846 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

As described above, a photolithography system according to the above-described embodiments may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 8:
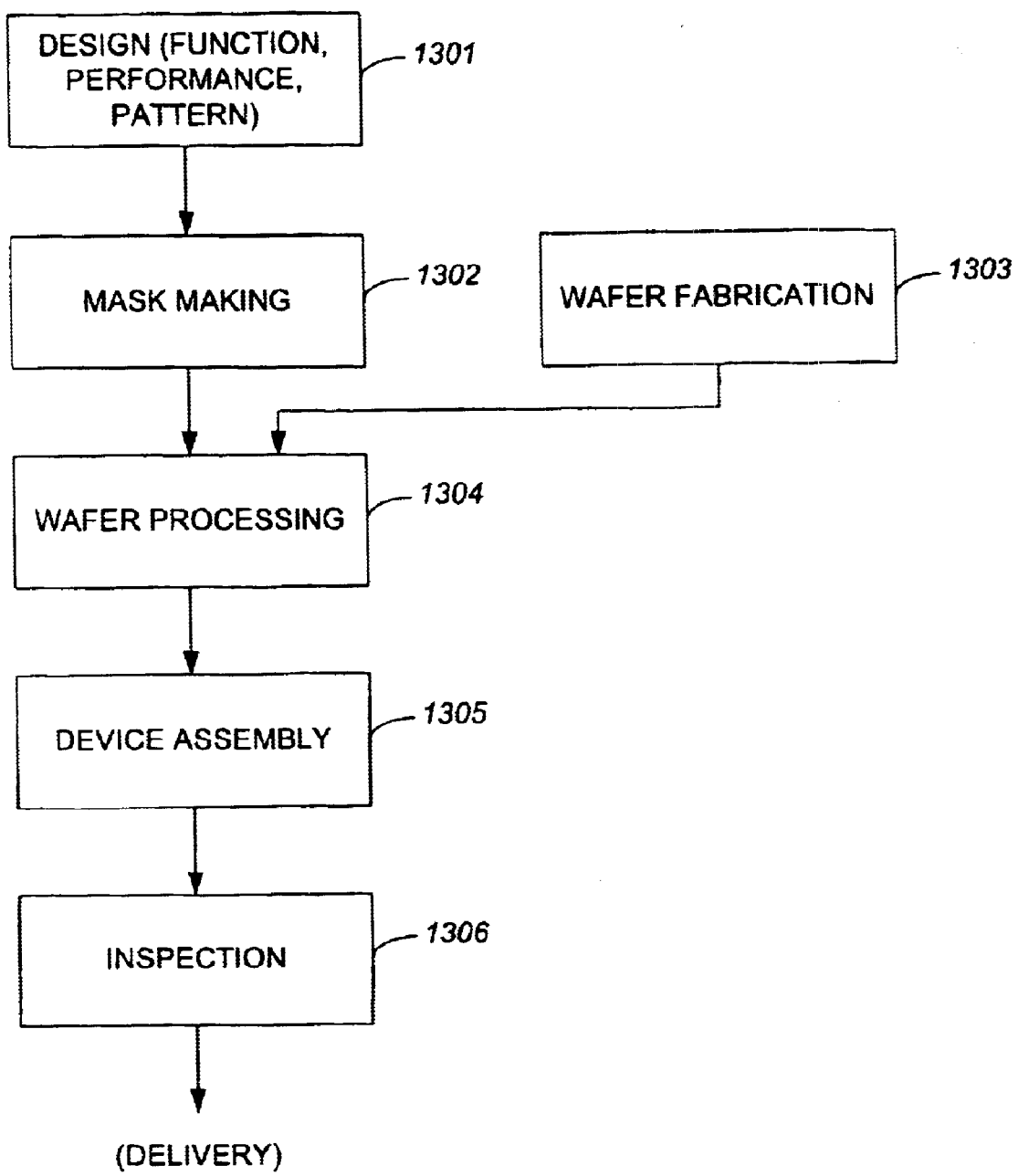
FIG. 8 is a process flow diagram which illustrates the steps associated with fabricating a semiconductor device in accordance with an embodiment of the present invention.

Further, semiconductor devices may be fabricated using systems described above, as will be discussed with reference to FIG. 8. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system that includes a coarse reticle scanning stage and a fine reticle scanning stage that accelerates with the coarse reticle scanning stage as described above. One process of exposing a mask pattern onto a wafer will be described below with respect to FIG. 9. In step 1305, the semiconductor device is assembled. The assembly of the semiconductor device generally includes, but is not limited to, wafer dicing processes, bonding processes, and packaging processes. Finally, the completed device is inspected in step 1306.

Figure 9:
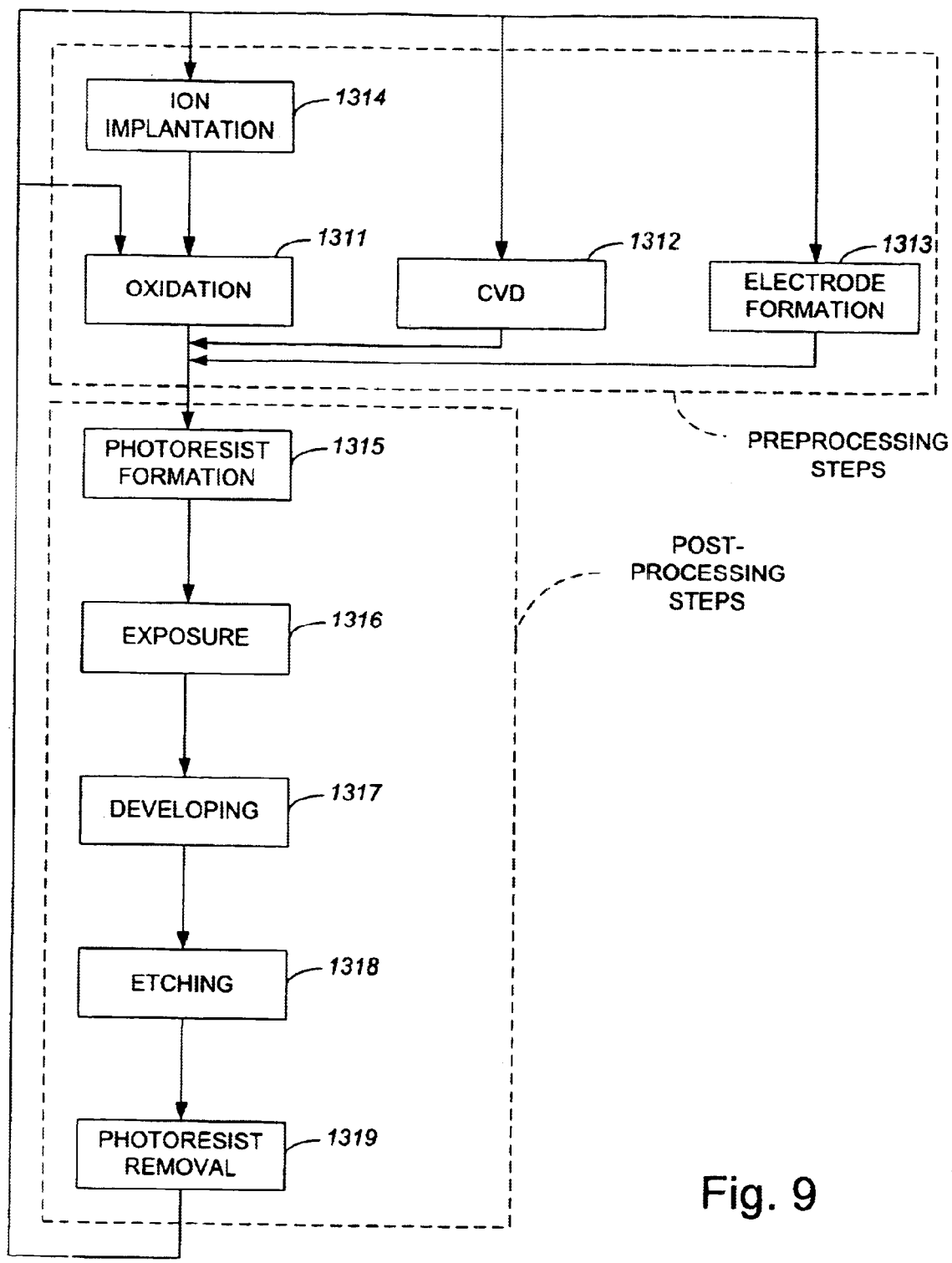
FIG. 9 is a process flow diagram which illustrates the steps associated with processing a wafer, i.e., step 1304 of FIG. 8, in accordance with an embodiment of the present invention.

FIG. 9 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage. In one embodiment, scanning the reticle scanning stage includes accelerating a fine stage with a coarse stage using a cord, then accelerating the fine stage substantially independently from the coarse stage.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

While cords are suitable for providing an overall reticle scanning stage device with dual force mode capabilities, it should be appreciated that cords are just one example of a "variable coupler," i.e., a coupler between a coarse stage and a fine stage that may alternately be characterized by allowing high transmissibility between the stages and allowing relatively low transmissibility between the stages. Other suitable couplers include, but are not limited to, opposing motors which are coupled to substantially stationary amplifiers, and stops.

Figure 10A:
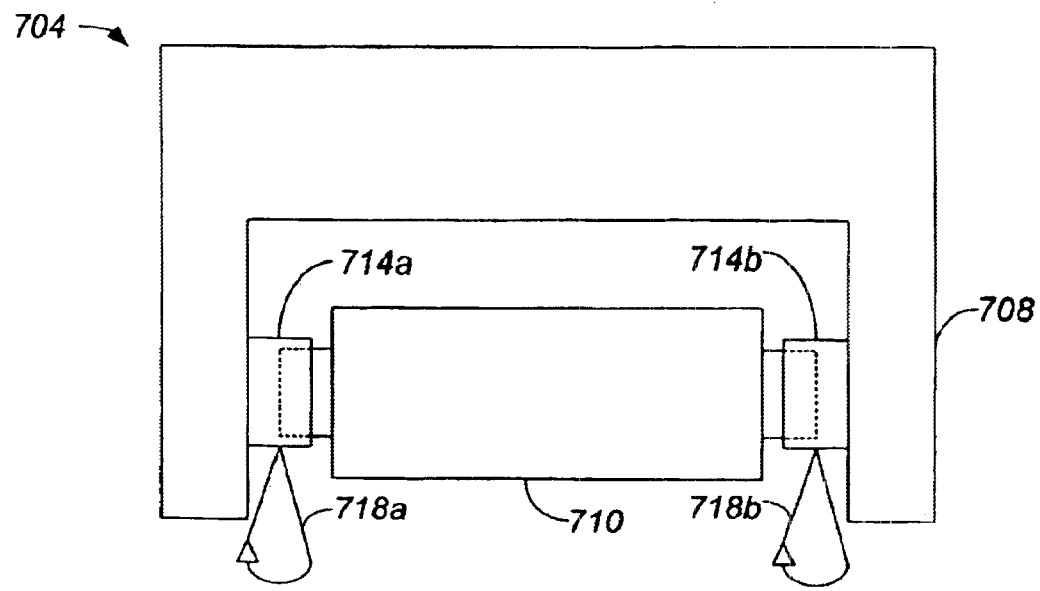
FIG. 10a is a diagrammatic representation of a fine stage which is substantially coupled to a coarse stage through opposing motors in accordance with an embodiment of the present invention.

FIG. 10*a* is a diagrammatic representation of a fine stage which is substantially coupled to a coarse stage through opposing motors in accordance with an embodiment of the present invention. A scanning stage 704 includes a coarse stage 708 and a fine stage 710 which are coupled through motors 714. For ease of illustration, actuators which control the fine positioning of fine stage 710 are not shown. Motors 714 are coupled to amplifiers 718, which are not carried on fine stage 710 or coarse stage 708, that are suitable for amplifying the force of motors 714. Hence, the size of motors 714 may be relatively small.

The use of amplifiers 718 enables motors 714 to be differentially controlled as necessary to enable fine stage 710 to accelerate with coarse stage 708. Hence, amplifiers 718 may essentially be used to control the amount of transmissibility between coarse stage 708 and fine stage 710. Typically, one of motors 714 may be a relatively high force, low accuracy motor, while the other one of motors 714 may be a relatively low force, high accuracy motor. For instance, motor 714*a* may be the relatively high force motor that is used, with amplifier 718*a*, when a large amount of force is needed to begin acceleration. Motor 714*b*, which may be a relatively low force motor, may be used after acceleration has begun, and less force is required to maintain the acceleration.

In one embodiment, the use of opposing motors 714, in lieu of cords, to allow fine stage 708 to accelerate with fine stage 710 provides more bandwidth, with respect to the control of acceleration, than is provided through the use of cords. Motor 714*a* may be used when a high amount of force is needed, and motor 714*b* may be used when less force is needed. The use of one motor 714*a* to provide a high force and another motor 714*b* to provide a lower force allows the dynamic range associated with controlling acceleration to be increased. Maintaining amplifiers 718 off of coarse stage 708 and fine stage 710 reduces the mass which is moved within scanning stage 704.

Opposing motors 714 may generally be substantially any suitable actuator. Typically, motor 714*b*, which is a low force actuator, may be a smaller actuator than motor 714*a*. Suitable actuators include, but are not limited to, E-core motors, C-core motors, and piezo actuators. It should be appreciated that although motor 714*a* and motor 714*b* may be the same type of actuator, motor 714*a* and motor 714*b* may also be different types of actuators.

Figure 10B:
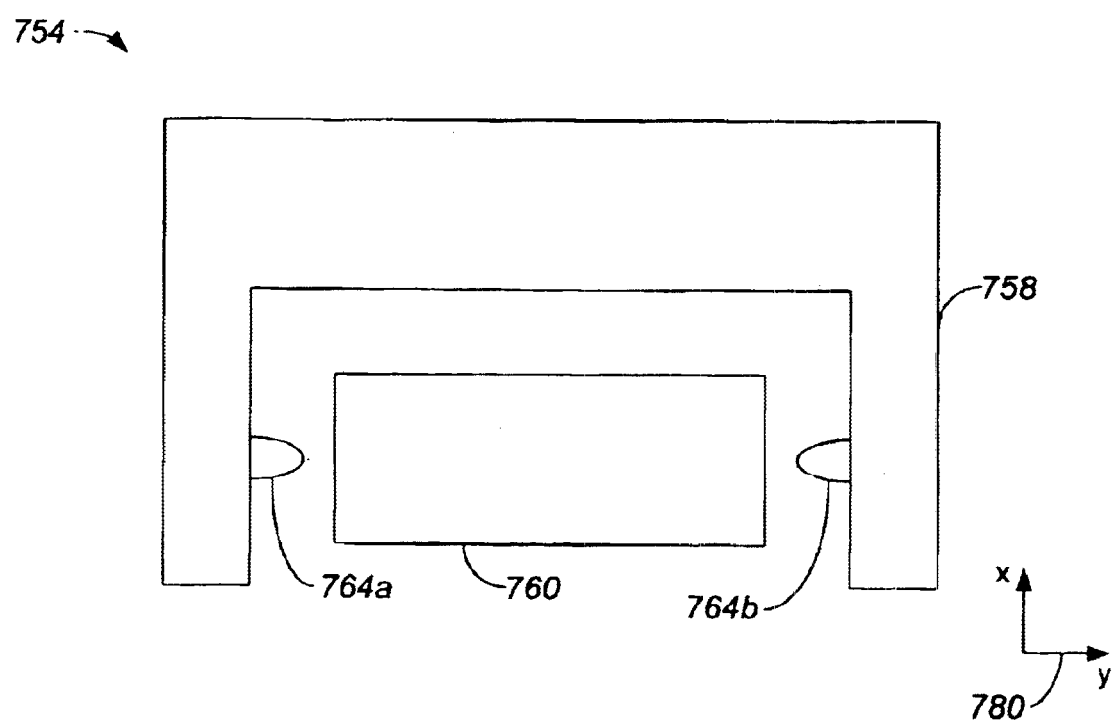
FIG. 10b is a diagrammatic representation of a fine stage which may be moved by a coarse stage through contact with bumpers on the coarse stage in accordance with an embodiment of the present invention.

As mentioned above, stoppers or bumpers may also be used to provide dual force mode capabilities in a scanning device. FIG. 10*b* is a diagrammatic representation of a fine stage which may be moved by a coarse stage through contact with bumpers on the coarse stage in accordance with an embodiment of the present invention. A scanning stage 754 includes a coarse stage 758 and a fine stage 760. Stage 754 also includes actuators which control the precise positioning of fine stage 760. For ease of illustration, the actuators which control the fine positioning of fine stage 760 are not shown.

Stoppers 764, which may be formed from a relatively stiff but slightly elastic material such as rubber, are arranged to enable coarse stage 758, when accelerating, to carry fine stage 760. For example, when coarse stage 758 accelerates in a positive direction with respect to a y-axis 780, stopper 764*a* may contact fine stage 760 to effectively push fine stage 760 to accelerate along with fine stage 760. That is, stopper 764*a*, which is physically coupled to coarse stage 758, carries fine stage 760 when coarse stage 758 accelerates in a positive direction with respect to y-axis 780. Alternatively, when coarse stage 758 accelerates in a negative direction with respect to y-axis 780, stopper 764*b* may contact fine stage 760 and effectively push fine stage 760 to accelerate along with coarse stage 758.

When a stopper 764, e.g., stopper 764*a*, makes contact with fine stage 760, the transmissibility between coarse stage 758 and fine stage 760 is relatively high, as stopper 764*a* which contacts fine stage 760 serves as a relatively stiff connection between coarse stage 758 and fine stage 760. When stopper 764*a* is in contact with fine stage 760, stopper 764*b* is not in contact with fine stage 760. As a result, there is substantially no transmissibility between coarse stage 758 and fine stage 760 through stopper 764*b*. It should be appreciated that when neither stopper 764*a* nor stopper 764*b* is in contact with fine stage 760, i.e., when coarse stage 758 is not accelerating, there is substantially no transmissibility between coarse stage 758 and fine stage 760 through either stopper 764.

Although only a few embodiments of the present invention have been described, it should be understood that the present invention may be embodied in many other specific forms without departing from the spirit or the scope of the present invention. By way of example, a coarse stage and a fine stage which are coupled by cords have been described as being suitable for use as a part of a reticle scanning stage. It should be appreciated that in addition to being suitable for use as a part of a reticle scanning stage, a coarse stage and a fine stage which are coupled by cords may be used as a part of substantially any suitable device which essentially requires high accuracy during periods of low acceleration and low accuracy during periods of high acceleration. Suitable devices include, but are not limited to, semiconductor wafer scanning stages.

A fine stage has been described as moving a reticle, as for example by accelerating a reticle, once a constant velocity has been reached. That is, in general, the fine stage may move a reticle while the coarse stage is still moving, but no longer accelerating. A fine stage may also move a reticle once a coarse stage has stopped, e.g., reached a desired position. When a fine stage is responsible for moving a reticle once an associated coarse stage is no longer accelerating, the coarse stage may either be moving at a constant velocity or stopped.

The cords used in an overall reticle scanning stage have been described as being of substantially the same size and composition. In other words, both a positive acceleration cord and a negative acceleration cord have been described as having substantially the same length, cross-sectional area, and shape, and as being formed from substantially the same material. It should be appreciated, however, that the two cords described above as being included in a reticle scanning stage may be such that the cords are not of the same size, and are not formed from the same material.

While the use of two cords or cables has been described as being suitable for use in enabling a fine stage to accelerate with a coarse stage, it the number of cords in an overall reticle scanning stage may be widely varied. For example, instead of using a single cord on each of two sides of a fine stage as discussed above, each of the two sides may be coupled to the coarse stage through two cords. The use of two cords on each of two sides of the fine stage may provide redundancy such that if a cord fails, the fine stage is still able to accelerate with the coarse stage.

It should be appreciated that instead of using opposing cords to enable a fine stage to accelerate with a coarse stage, opposing mechanisms which differ may be used. By way of example, a cord may be used to enable a fine stage to accelerate with the coarse stage in one direction, while a stopper may be used to enable the fine stage to accelerate with the coarse stage in another direction. In an embodiment in which a cord is used to facilitate acceleration in one direction while a stopper is used to facilitate acceleration in a substantially opposite direction, the cord and the stopper may be positioned on the same side of the fine stage, as the cord pulls the fine stage and the stopper pushes the fine stage.

The devices, mechanism, or entities used to enable acceleration of a coarse stage to pull or, in some cases, to push, a fine stage may vary widely without departing from the spirit or the scope of the present invention. While cords, actuators, and stoppers have been described, other suitable devices may include, but are not limited to, chains, flexible ribbons and pulley mechanisms.

The use of a dual force mode system which includes cords, stoppers, or opposing motors, may be applied to the coarse stage of an overall scanning stage. For example, cords may be used to facilitate the acceleration of a coarse stage such that a motor that scans the coarse stage may have lower power requirements. In one embodiment, cords which are coupled to opposite sides of a coarse stage, and are arranged to augment acceleration of the coarse stage along a y-axis, may be coupled to actuators which are substantially stationary. These actuators, e.g., linear motors, may apply force to the coarse stage through the cables. In other words, the cables may assist the linear motors in moving the coarse stage. As will be appreciated by those skilled in the art, linear motors which are stationary are relatively easy to shield, and to isolate. Further, the use of such linear motors which are substantially stationary enables the motor that may couple the coarse stage to a base, e.g., a motor which includes extension 324 and magnet track 320 of FIGS. 3*a* and 3*b*, to have less of a power requirement and, hence, less mass.

The steps associated with positioning a reticle using a reticle scanning stage of the present invention may vary. Steps may generally, be altered, reordered, added, and removed without departing from the spirit or the scope of the present invention.

Therefore, the present examples are to be considered as illustrative and not restrictive, and the invention is not to be limited to the details given herein, but may be modified within the scope of the appended claims.

What is claimed is:

1. A scanning apparatus, the scanning apparatus being suitable for scanning an object along a first axis, the scanning apparatus comprising:
a first actuator;
a first stage, the first stage being coupled to the first actuator, the first actuator being arranged to move the first stage along the first axis;
a second stage, the second stage being arranged to accommodate the object;
a first coupler, the first coupler having a first end and a second end, the first coupler being aligned along the first axis, wherein the first end of the first coupler is arranged to contact the first stage and the second end of the first coupler is arranged to contact the second stage, the first coupler being a stopper, the first end of the first coupler being a first end of the stopper that is substantially directly coupled to the first stage, the second end of the first coupler being a second end of the stopper being arranged to contact the second stage to substantially push the second stage when the first actuator causes the first stage to scan along the first axis in the first direction; and
a second coupler, the second coupler having a first end and a second end, the second coupler being aligned along the first axis, wherein the first end of the second coupler is arranged to contact the first stage and the second end of the second coupler is arranged to contact the second stage, and wherein when the first actuator causes the first stage to scan along the first axis in a first direction, the first coupler causes the second stage to scan along the first axis through the first coupler.

2. A scanning apparatus according to claim 1 further including:
a second actuator, the second actuator being arranged to act between the first stage and arranged to move the second stage along the first axis substantially independently from the first stage.

3. A scanning apparatus according to claim 2 wherein the first actuator is arranged to accelerate the first stage and the second stage along the first axis, and the second actuator is arranged to accelerate the second stage along the first axis.

4. A scanning apparatus according to claim 2 wherein when the first actuator causes the first stage to scan along the first axis in a first direction, the first coupler is in a first state and the second coupler is in a second state.

5. An exposure apparatus comprising the scanning apparatus of claim 1.

6. A device manufactured with the exposure apparatus of claim 5.

7. A wafer on which an image has been formed by the exposure apparatus of claim 5.

8. A scanning apparatus, the scanning apparatus being suitable for scanning an object along a first axis, the scanning apparatus comprising:
a first actuator;
a first stage, the first stage being coupled to the first actuator, the first actuator being arranged to move the first stage along the first axis;
a second stage, the second stage being arranged to accommodate the object;
a second actuator, the second actuator being arranged to act between the first stage and arranged to move the second stage along the first axis substantially independently from the first stage;
a first coupler, the first coupler having a first end and a second end, the first coupler being aligned along the first axis, wherein the first end of the first coupler is arranged to contact the first stage and the second end of the first coupler is arranged to contact the second stage; and
a second coupler, the second coupler having a first end and a second end, the second coupler being aligned along the first axis, the first end of the second coupler being arranged to contact the first stage and the second end of the second coupler being arranged to contact the second stage, the first coupler causing the second stage to scan along the first axis through the first coupler when the first actuator causes the first stage to scan along the first axis in a first direction, wherein when the first actuator causes the first stage to scan along the first axis in a first direction, the first coupler is in a first state to provide a substantially rigid coupling between the first stage and the second stage and the second coupler is in a second state to enable substantially minimal vibrations to be transmitted between the first stage and the second stage through the second coupler.

9. A scanning apparatus according to claim 8 wherein the first coupler is a first cord and the second coupler is a second cord.

10. A scanning apparatus according to claim 2 wherein when the first actuator causes the first stage to scan along the first axis in a second direction, the first coupler is in a second state and the second coupler is in a first state.

11. A scanning apparatus according to claim 10 wherein when the first coupler is in the first state, the first coupler provides a substantially rigid coupling between the first stage and the second stage, and wherein when the second coupler is in the second state, the second coupler enables substantially minimal vibrations to be transmitted between the first stage and the second stage through the second coupler.

12. A scanning apparatus according to claim 1 wherein when the first stage is not moving, the first coupler and the second coupler are arranged such that the first coupler and the second coupler enable substantially minimal vibrations to be transmitted between the first stage and the second stage.

13. A positioning apparatus comprising:
a first stage, the first stage being arranged to be movable along at least one axis;
a first driving device coupled to the first stage, the first driving device moving the first stage along the at least one axis;
a second stage, the second stage being arranged to be movable with the first stage along the at least one axis;
a second driving device coupled to the second stage, the second driving device moving the second stage relative to the first stage; and
an actuator disposed between the first stage and the second stage, the actuator being arranged to apply a force to the second stage, wherein when the first driving device accelerates the first stage along the at least one axis in a first direction, the actuator applies the force such that the first stage provides a pulling force on the second stage from a direction of movement of the second stage, and when at least one of a first speed of the first stage and a second speed of the second stage is substantially constant, the second driving device moves the second stage to position the second stage at a desired position.

14. An exposure apparatus comprising the positioning apparatus of claim 13.

15. A device manufactured with the exposure apparatus of claim 14.

16. A wafer on which an image has been formed by the exposure apparatus of claim 13.

17. A method for positioning an object, the method comprising:

accelerating a first stage along at least one axis;

accelerating a second stage with the first stage along the at least one axis in a first direction by an actuator disposed between the first stage and the second stage when the first stage accelerates in the first direction, wherein the actuator accelerates the second stage such that the first stage acts as a pulling force on the second stage from a direction of movement of the second stage; and positioning the second stage by utilizing a driving device that moves the second stage relative to the first stage when at least one of a first speed of the first stage and a second speed of the second stage is constant.

18. A method for operating an exposure apparatus comprising the method for positioning an object of claim 17.

19. A method for making an object including at least a photolithography process, wherein the photolithography process utilizes the method of operating an exposure apparatus of claim 18.

20. A method for making a wafer utilizing the method of operating an exposure apparatus of claim 18.

21. A scanning apparatus, the scanning apparatus being suitable for scanning an object along a first axis, the scanning apparatus comprising:

a first actuator;

a first stage, the first stage being coupled to the first actuator, the first actuator being arranged to move the first stage along the first axis;

a second stage, the second stage being arranged to accommodate the object;

a first coupler, the first coupler having a first end and a second end, the first coupler being aligned along the first axis, wherein the first end of the first coupler is arranged to contact the first stage and the second end of the first coupler is arranged to contact the second stage; and a second coupler, the second coupler having a first end and a second end, the second coupler being aligned along the first axis, wherein the first end of the second coupler is arranged to contact the first stage and the second end of the second coupler is arranged to contact the second stage, and wherein when the first actuator causes the first stage to scan along the first axis in a first direction, the first coupler causes the second stage to scan along the first axis through the first coupler, wherein the first coupler is a stopper, the first end of the first coupler being a first end of the stopper that is substantially directly coupled to the first stage, the second end of the first coupler being a second end of the stopper that is arranged to contact the second stage to substantially push the second stage when the first actuator causes the first stage to scan along the first axis in the first direction.

22. A stage apparatus comprising:

a first assembly, the first assembly including a first stage and a first actuator, the first stage being coupled to the first actuator, the first actuator being arranged to move the first stage along a first axis;

a second assembly, the second assembly including a second stage; and a second actuator, the second actuator being arranged substantially between the first stage and the second stage, wherein when the first actuator moves the first stage along the first axis, the second actuator is arranged to apply a force to the second stage and to substantially control acceleration of the second stage.

23. The stage apparatus of claim 22 wherein the second actuator is an electromagnetic actuator.

24. The stage apparatus of claim 22 further including:

a third actuator, the third actuator being arranged to cooperate with the second actuator to apply the force to the second stage and to substantially control the acceleration of the second stage.

25. The stage apparatus of claim further comprising:

a fine actuator that actuates the second stage when the second actuator does not apply the force to the second stage.

* * * * *